United States Patent
Kim et al.

(10) Patent No.: US 8,859,319 B2
(45) Date of Patent: Oct. 14, 2014

(54) METHODS OF FORMING PHOTO DETECTORS

(75) Inventors: Sang Hoon Kim, Daejeon (KR); Gyungock Kim, Daejeon (KR); In Gyoo Kim, Daejeon (KR); JiHo Joo, Goyang (KR); Ki Seok Jang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 136 days.

(21) Appl. No.: 13/612,736

(22) Filed: Sep. 12, 2012

(65) Prior Publication Data

US 2013/0149806 A1    Jun. 13, 2013

(30) Foreign Application Priority Data

Dec. 7, 2011    (KR) .................... 10-2011-0130309

(51) Int. Cl.
*H01L 31/18*    (2006.01)
(52) U.S. Cl.
USPC ............. 438/57; 438/69; 438/77; 438/483; 438/31; 257/E31.127
(58) Field of Classification Search
USPC ............. 438/57, 77, 93, 31, 479, 478, 483
See application file for complete search history.

(56) References Cited

U.S. PATENT DOCUMENTS

| | | | |
|---|---|---|---|
| 5,994,724 A * | 11/1999 | Morikawa | 257/184 |
| 7,596,158 B2 * | 9/2009 | Liu et al. | 372/43.01 |
| 8,257,997 B2 * | 9/2012 | Chen et al. | 438/71 |
| 2010/0006961 A1 * | 1/2010 | Yasaitis et al. | 257/431 |
| 2010/0151619 A1 * | 6/2010 | Yasaitis et al. | 438/93 |
| 2011/0049660 A1 * | 3/2011 | Suh et al. | 257/432 |
| 2011/0064360 A1 * | 3/2011 | Jeong | 385/39 |
| 2011/0084308 A1 * | 4/2011 | Loh et al. | 257/190 |
| 2011/0133187 A1 * | 6/2011 | Kim et al. | 257/51 |
| 2012/0039564 A1 * | 2/2012 | Kang et al. | 385/14 |
| 2013/0001643 A1 * | 1/2013 | Yagi | 257/184 |
| 2013/0156057 A1 * | 6/2013 | Kim et al. | 372/44.01 |
| 2013/0202005 A1 * | 8/2013 | Dutt | 372/50.1 |

FOREIGN PATENT DOCUMENTS

WO    WO 2005/083750 A2    9/2005

OTHER PUBLICATIONS

Laurent Vivien et al., "42 GHz p.i.n Germanium photodetector integrated in a silicon-oninsulator waveguide", Optics Express, Apr. 13, 2001, pp. 6252-6257, vol. 17, No. 8.
I. Åberg et al., "A Low Dark Current and High Quantum Efficiency Monolithic Germanium-on-Silicon CMOS Imager Technology for Day and Night Imaging Applications", IEDM, 2010, pp. 14.4.1-14.4.4, IEEE.

* cited by examiner

*Primary Examiner* — Savitr Mulpuri

(57) ABSTRACT

Methods of forming photo detectors are provided. The method includes providing a semiconductor layer on a substrate, forming a trench in the semiconductor layer, forming a first single crystalline layer and a second single crystalline layer using a selective single crystalline growth process in the trench, and patterning the first and second single crystalline layers and the semiconductor layer to form a first single crystalline pattern, a second single crystalline pattern and an optical waveguide.

19 Claims, 12 Drawing Sheets

METHODS OF FORMING PHOTO DETECTORS

CROSS-REFERENCE TO RELATED APPLICATIONS

This U.S. non-provisional patent application claims priority under 35 U.S.C. §119 to Korean Patent Application No. 10-2011-0130309, filed on Dec. 7, 2011, the disclosure of which is hereby incorporated by reference in its entirety.

BACKGROUND

The present disclosure herein relates to methods of forming photo detectors and, more particularly, to methods of forming photo detectors using a selective epitaxial growth (SEG) process.

Recently, various technologies for photo devices have been remarkably developed. In particular, technologies for optical communication devices and image sensors have been continuously developed. The optical communication devices may utilize lights as information media, and the image sensors may receive lights reflected from objects to generate electrical signals. The image sensors or photo detectors may be fabricated using semiconductor materials. The image sensors or the photo detectors may include an absorption layer formed of the semiconductor material and the absorption layer may receive lights to generate electron-hole pairs. The electrons and the holes generated in the absorption layer may move toward two separate electrodes, thereby generating the electrical signals.

In general, PIN photo detectors of an indium gallium arsenide (InGaAs) exhibiting a high reactivity and a high speed may be widely used as high performance photo detectors which can be integrated with complementary metal oxide semiconductor (CMOS) circuit devices. However, the PIN photo detectors of an InGaAs may have a disadvantage of high fabrication costs.

To solve the above disadvantage, various fabrication techniques have been developed to form high performance photo detectors exhibiting high reliability and excellent electrical characteristics.

SUMMARY

Exemplary embodiments may provide methods of forming photo detectors.

According to some embodiments, a method of forming a photo detector includes providing a semiconductor layer on a substrate, forming a trench in the semiconductor layer, forming a first single crystalline layer and a second single crystalline layer using a selective single crystalline growth process in the trench, and patterning the first and second single crystalline layers and the semiconductor layer to form a first single crystalline pattern, a second single crystalline pattern and an optical waveguide.

In some embodiments, the trench may be formed such that a portion of the semiconductor layer remains under the trench. In such a case, the method may further includes injecting dopants of a first conductivity type into the semiconductor layer remained under the trench, thereby forming a doping region.

In some embodiments, the method may further include forming a buried insulation layer between the semiconductor layer and the substrate.

In some embodiments, the doping region may contact with the buried insulation layer.

In some embodiments, the method may further includes forming an interlayer dielectric layer on the substrate including the first single crystalline pattern, the second single crystalline pattern and the optical waveguide, and forming first metal pads and a second metal pad that penetrate the interlayer dielectric layer. The first metal pads may contact with the doping region, and the second metal pad may contact with the second single crystalline pattern.

In some embodiments, the second single crystalline pattern may include dopants of a second conductivity type, and the second conductivity type may be different from the first conductivity type.

In some embodiments, forming the first and second single crystalline patterns and the optical waveguide may include etching a portion of the first single crystalline layer, a portion of the second single crystalline layer and a portion of the semiconductor layer to expose at least a portion of the doping region.

In some embodiments, the optical waveguide may be formed to upwardly protrude from the semiconductor layer remained under the trench.

In some embodiments, the optical waveguide may be formed to have a line-shape extending in one direction, and an end of the optical waveguide may be in contact with the first single crystalline pattern.

In some embodiments, the first and second single crystalline patterns and the optical waveguide may be formed using two separate patterning processes.

In some embodiments, forming the first single crystalline layer may include growing a single crystalline layer on sidewalls and a bottom surface of the trench.

In some embodiments, the selective single crystalline growth process may be performed using a reduced pressure chemical vapor deposition (RPCVD) process or an ultra-high vacuum chemical vapor deposition (UHVCVD) process.

In some embodiments, the first single crystalline layer may be formed by the RPCVD process or the UHVCVD process that is performed using a first reaction gas including a germane ($GeH_4$) gas and a hydrogen gas at a deposition temperature of about 550° C. to about 650° C., and the first reaction gas may be supplied at a flow rate of about 10 sccm to about 50 sccm.

In some embodiments, the second single crystalline layer may be formed by the RPCVD process or the UHVCVD process that is performed using a second reaction gas including a source gas containing a semiconductor element, a carrier gas and an etching gas at a deposition temperature of about 600° C. to about 800° C.

In some embodiments, the source gas may include at least one of a dichlorosilane ($SiH_2Cl_2$) gas, a silicon tetrachloride ($SiCl_4$) gas, a silane ($SiH_4$) gas and a germane ($GeH_4$) gas, the carrier gas may include a hydrogen gas, and the etching gas may include a hydrogen chloride (HCl) gas.

In some embodiments, the hydrogen chloride (HCl) gas may be supplied at a flow rate of about 10 sccm to about 200 sccm.

In some embodiments, the second reaction gas may further include a dopant gas, and the dopant gas may include a diborane ($B_2H_6$) gas or a phosphine ($PH_3$) gas.

In some embodiments, the selective single crystalline growth process for forming the first single crystalline layer and the second single crystalline layer may be performed in a single process chamber.

In some embodiments, a depth of the trench may be equal to a width thereof or at least 1.5 times greater than the width of the trench in one direction.

In some embodiments, the second single crystalline layer may be formed to a thickness of about 50 nanometers to about 300 nanometers.

BRIEF DESCRIPTION OF THE DRAWINGS

Embodiments of the inventive concept will become more apparent in view of the attached drawings and accompanying detailed description.

FIGS. 1A to 6A are perspective views illustrating a method of forming a photo detector according to an exemplary embodiment.

FIGS. 1B to 6B are cross sectional views taken along respective ones of lines I-I' of FIGS. 1A to 6A to illustrate a method of forming a photo detector according to an exemplary embodiment.

DETAILED DESCRIPTION OF THE EMBODIMENTS

Figure 1A:
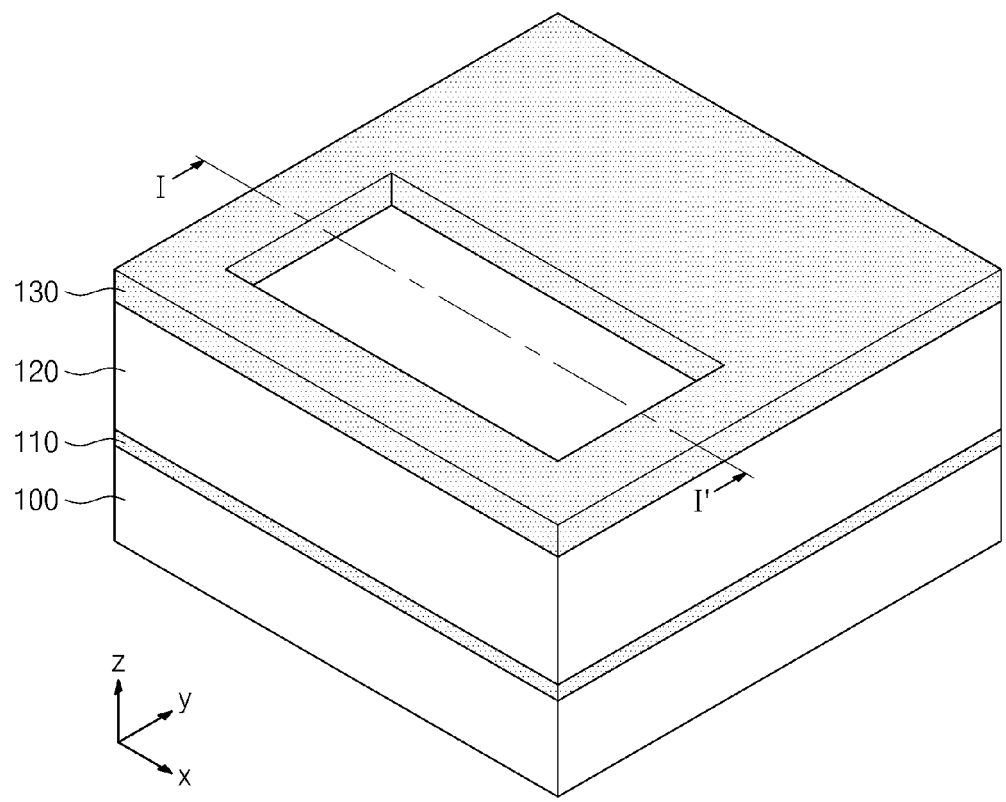

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, the exemplary embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that the terms "has", "having", "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. It will be further understood that when an element such as a layer, region or substrate is referred to as being "on" another element, it can be directly on the other element or intervening elements may be present. In contrast, the term "directly" means that there are no intervening elements. Similarly, It will be also understood that when an element is referred to as being "connected" or "coupled" to another element, it may be directly connected or coupled to the other element or intervening elements may be present.

Additionally, the embodiment in the detailed description will be described with perspective views and sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, a region illustrated as a rectangle may have rounded or curved features. Thus, areas exemplified in the drawings have general properties, and are used to illustrate specific shapes of elements. Accordingly, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concepts. Exemplary embodiments of aspects of the present inventive concept explained and illustrated herein include their complementary counterparts. The same reference numerals or the same reference designators denote the same elements throughout the specification.

Figure 4A:
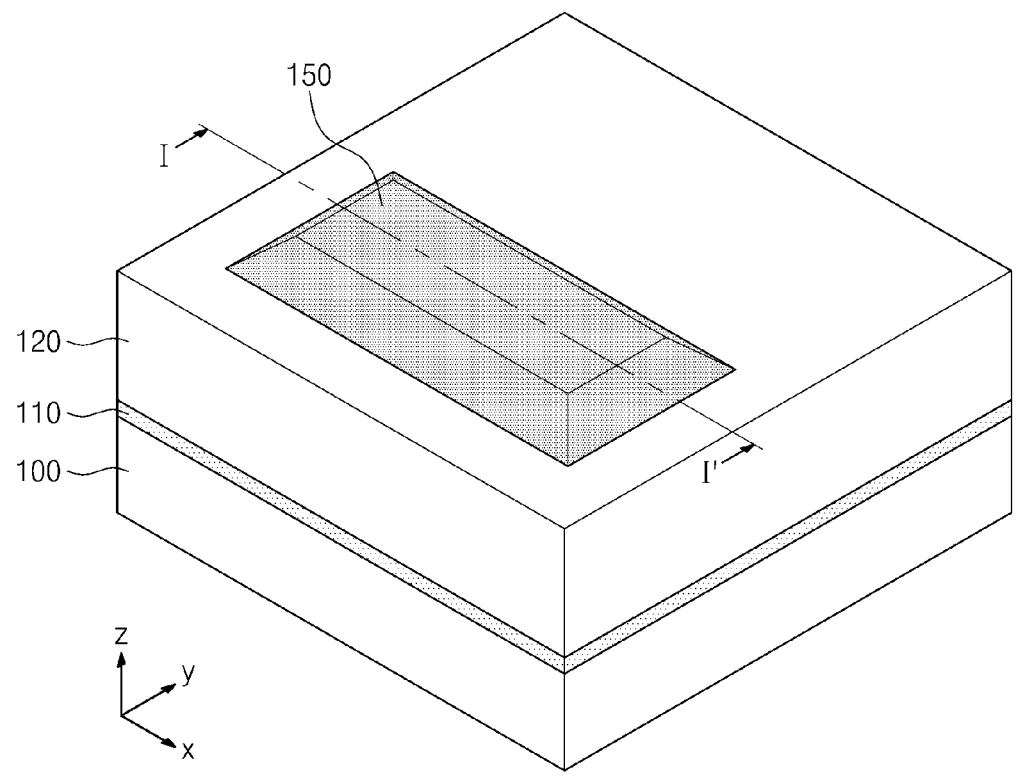
Figure 4B:
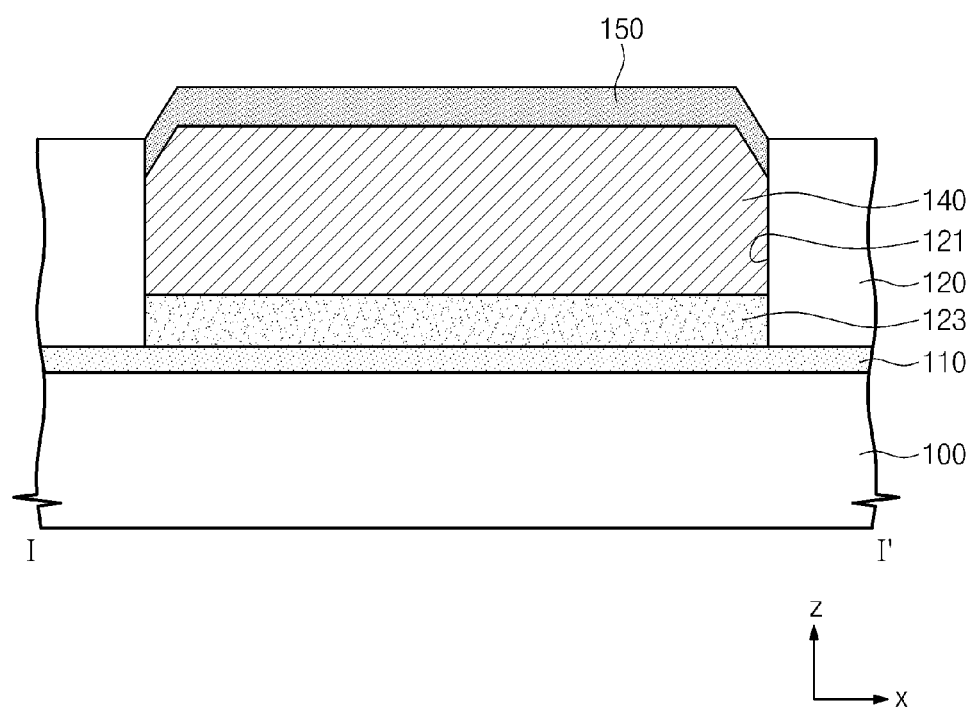
Figure 5A:
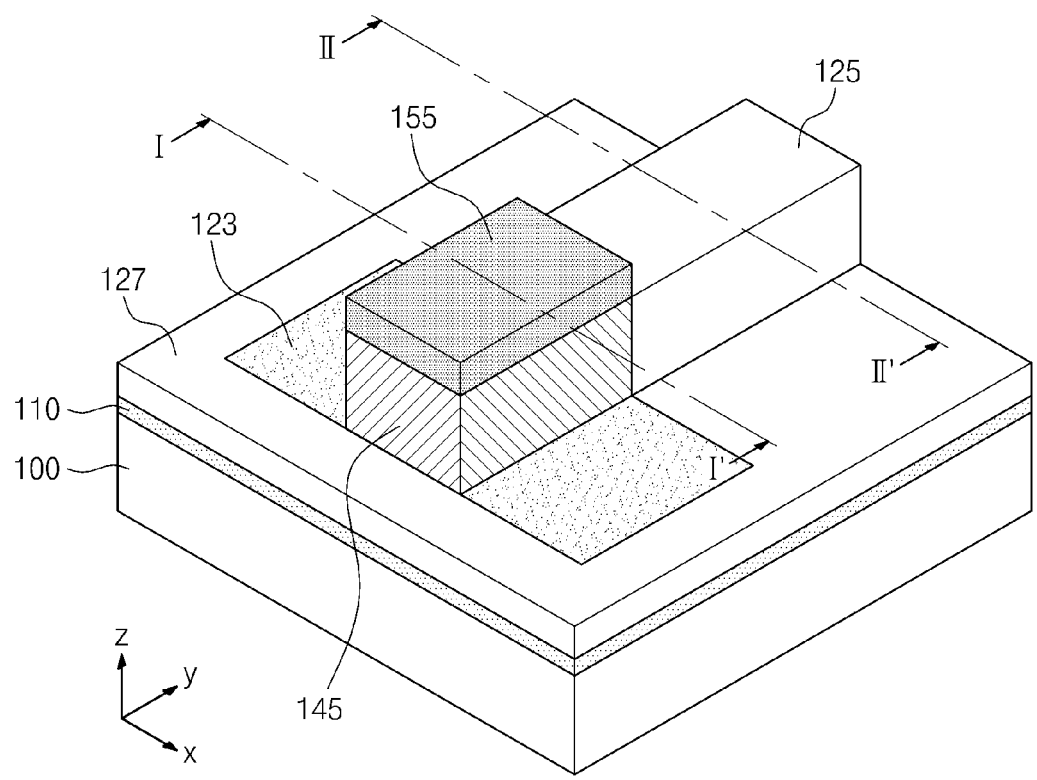

FIGS. 1A to 6A are perspective views illustrating a method of forming a photo detector according to an exemplary embodiment, FIGS. 1B to 6B are cross sectional views taken along respective ones of lines I-I' of FIGS. 1A to 6A, and FIG. 5C is a cross sectional view taken along a line II-II' of FIG. 5A.

Figure 1B:
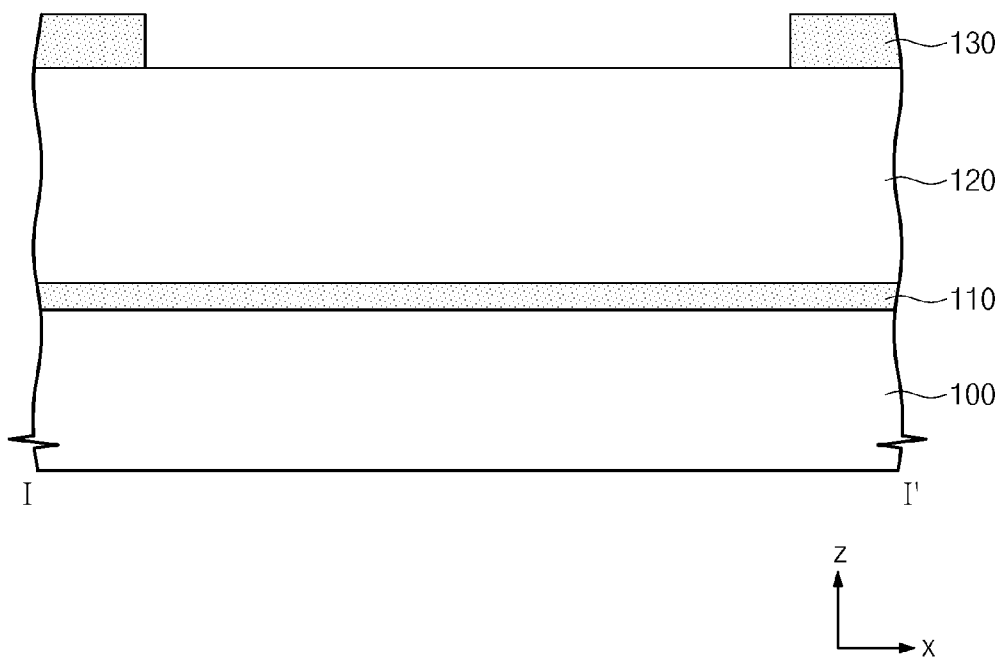

Referring to FIGS. 1A and 1B, a buried insulation layer 110 and a semiconductor layer 120 may be formed on a bulk substrate 100. That is, the buried insulation layer 110 may be disposed between the bulk substrate 100 and the semiconductor layer 120. The bulk substrate 100 and the semiconductor layer 120 may include the same semiconductor element. For example, the bulk substrate 100 and the semiconductor layer 120 may include silicon or geranium. The buried insulation layer 110 may include an oxide layer, a nitride layer or an oxynitride layer. According to an exemplary embodiment, the bulk substrate 100, the buried insulation layer 110 and the semiconductor layer 120 may constitute a silicon-on-insulator (SOI) substrate. According to some exemplary embodiments, the semiconductor layer 120 may be directly disposed on the bulk substrate 100 without formation of the buried insulation layer 110.

A mask pattern 130 may be formed on the semiconductor layer 120 opposite to the bulk substrate 100. The mask pattern 130 may be formed to include an opening. The opening of the mask pattern 130 may expose at least a portion of the semiconductor layer 120. According to an exemplary embodiment, the mask pattern 130 may be formed by depositing a mask layer on the semiconductor layer 120 and etching the mask layer. The mask layer may be formed of a material layer having an etch selectivity with respect to the semiconductor layer 120. For example, when the semiconductor layer 120 is formed of a polysilicon layer, the mask layer may be formed to include an oxide layer, a nitride layer or an oxynitride layer.

Figure 2A:
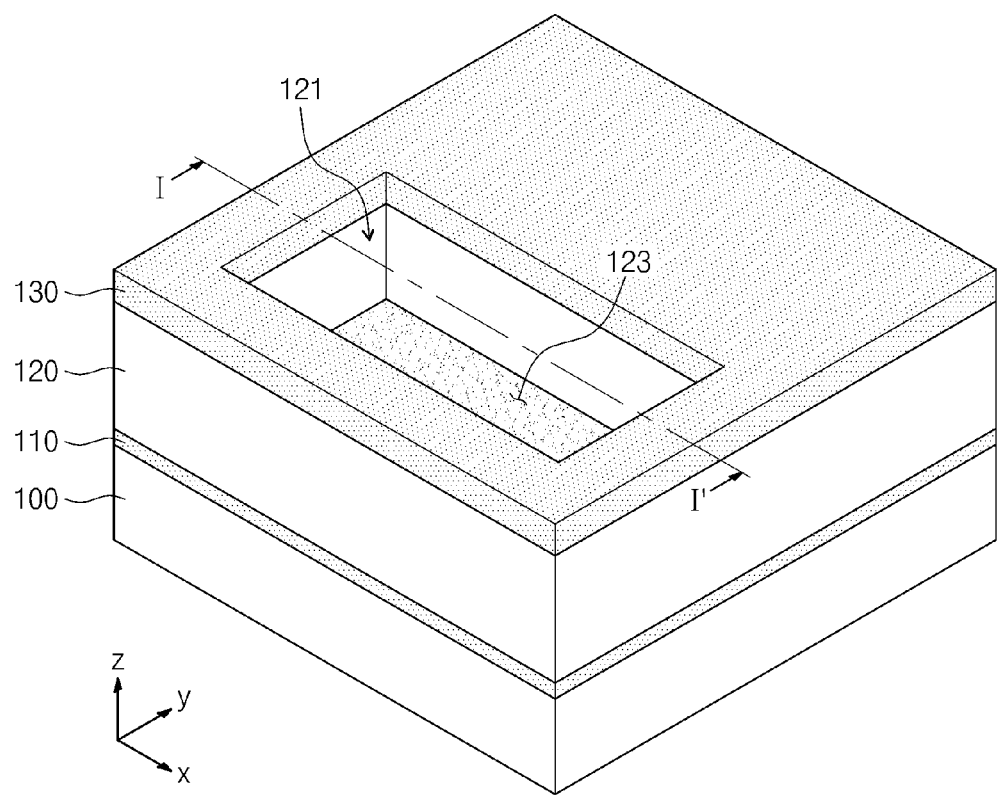
Figure 2B:
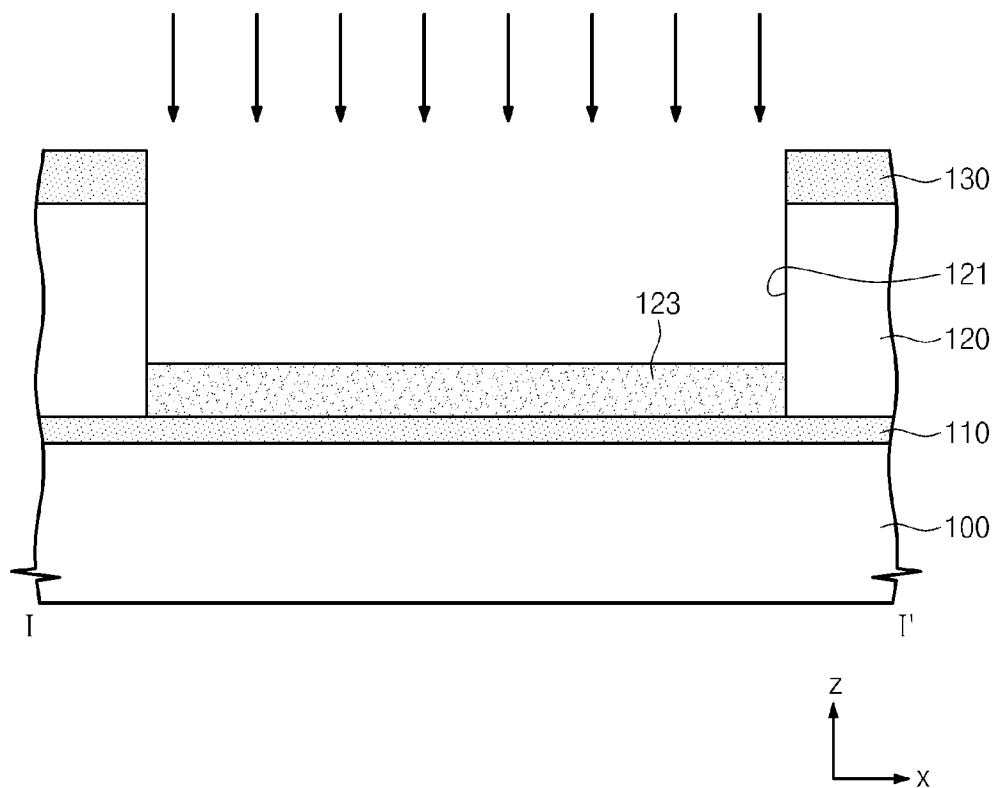

Referring to FIGS. 2A and 2B, a trench 121 may be formed in the semiconductor layer 120. The trench 121 may be formed by etching the semiconductor layer 120 using the mask pattern 130 as an etching mask. Etching the semiconductor layer 120 for forming the trench 121 may be performed using at least one of a dry etching process and a wet etching process.

The trench 121 may be formed to have a bottom surface which is higher than a bottom surface of the semiconductor layer 120. That is, the trench 121 may be formed by partially etching the semiconductor layer 120. In such a case, the bottom surface of the trench 121 may correspond to a surface of a portion of the semiconductor layer 120. Therefore, a portion of the semiconductor layer 120 may be disposed between the trench 121 and the buried insulation layer 110.

The trench 121 may be formed to have a first width in a first direction. The first direction may be parallel with an x-axis. In an exemplary embodiment, a height (e.g., a depth) of the trench 121 may be less than the first width thereof. Alternatively, the height (e.g., the depth) of the trench 121 may be equal to or greater than the first width thereof. For example, the height (e.g., the depth) of the trench 121 may be at least 1.5 times greater than the first width thereof.

A doping region 123 may be formed in the semiconductor layer 120 remained under the trench 121. The doping region 123 may be formed by injecting dopants of a first conductivity type into the semiconductor layer 120 which is exposed by the trench 121. In an exemplary embodiment, dopants of the first conductivity type may be dopants of N-type. In an exemplary embodiment, the doping region 123 may be formed to be in contact with the buried insulation layer 110, but not limited thereto. That is, the doping region 123 may be formed to have various shapes which are different from the shape illustrated in FIG. 2B. For example, the doping region 123 may be formed such that a bottom surface of the doping region 123 is located at a higher level than a top surface of the buried insulation layer 110.

Figure 3A:
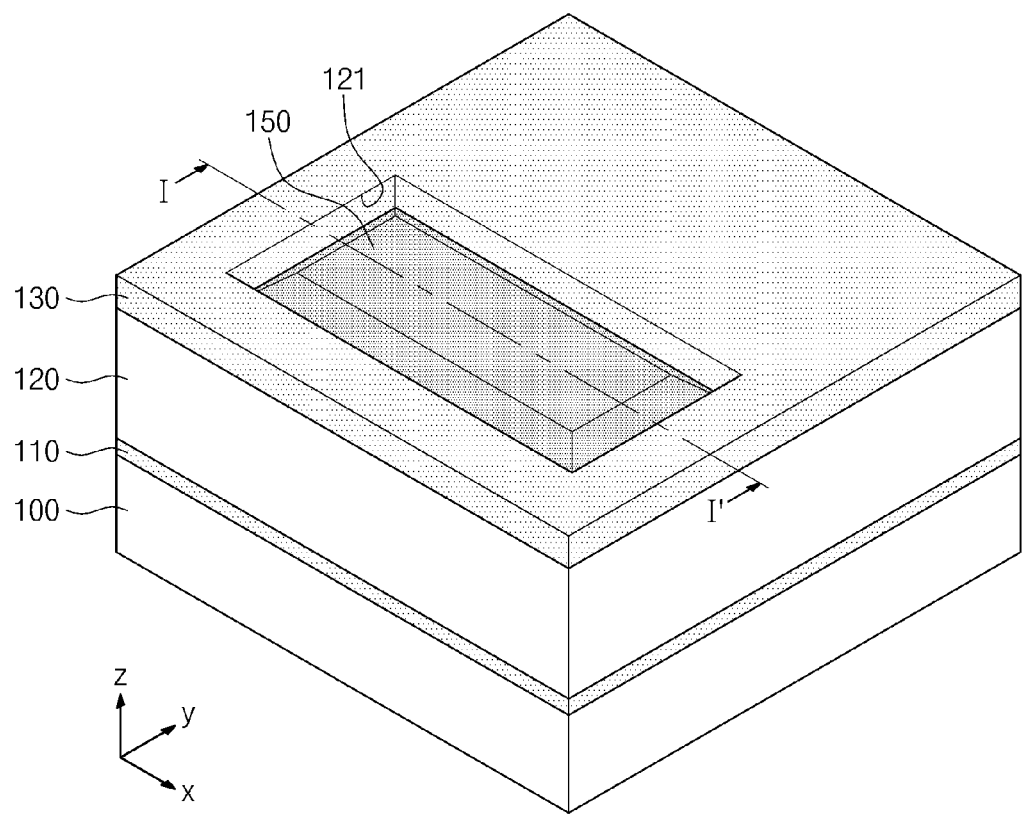
Figure 3B:
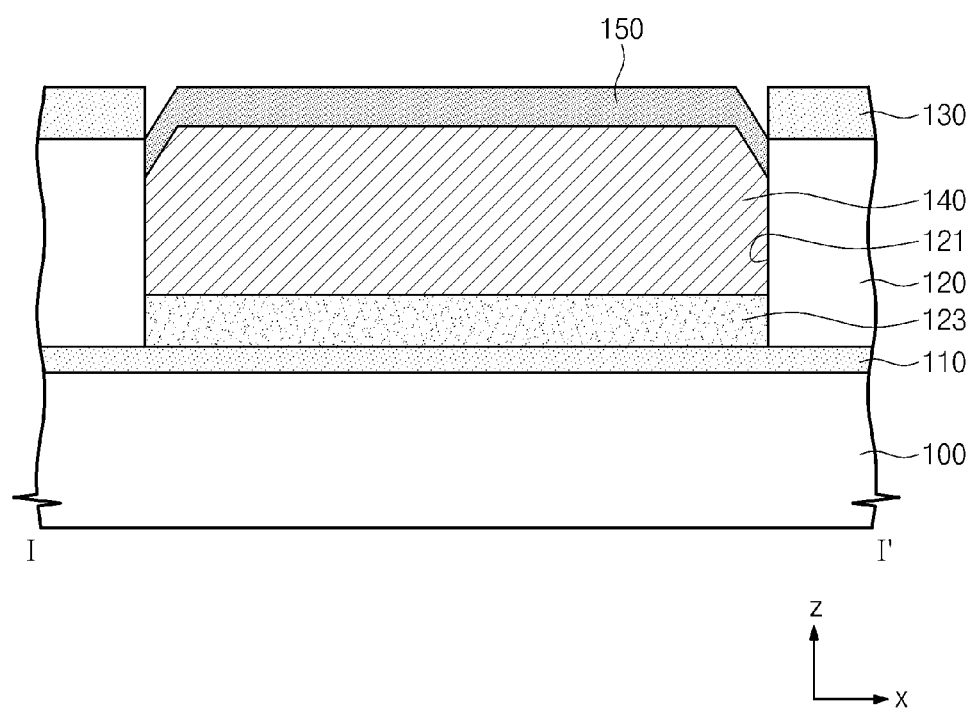

Referring to FIGS. 3A and 3B, a first single crystalline layer 140 may be formed in the trench 121. In an exemplary embodiment, the first single crystalline layer 140 may be formed such that a top surface of the first single crystalline layer 140 is substantially coplanar with a top surface of the semiconductor layer 120, but not limited thereto. Unlike the drawings, the first single crystalline layer 140 may be formed such that a top surface of the first single crystalline layer 140 is located at a higher or lower level than a top surface of the semiconductor layer 120.

The first single crystalline layer 140 may include a semiconductor element different from a semiconductor element included in the semiconductor layer 120. In an exemplary embodiment, the first single crystalline layer 140 may include a semiconductor element having a higher carrier mobility (e.g., a higher electron mobility and a higher hole mobility) than a semiconductor element included in the semiconductor layer 120. For example, in the event that the semiconductor layer 120 is formed of a semiconductor material including a silicon element, the first single crystalline layer 140 may be formed of a semiconductor material including a germanium element.

According to some exemplary embodiments, the first single crystalline layer 140 may be formed using a selective single crystalline growth process that employs the semiconductor layer 120 and the doping region 123 defining the trench 121 as seed layers. That is, the first single crystalline layer 140 may be formed of a single crystalline material which is grown on the sidewall surfaces and the bottom surface of the trench 121. For example, the selective single crystalline growth process for forming the first single crystalline layer 140 may be performed using a reduced pressure chemical vapor deposition (RPCVD) process and/or an ultra-high vacuum chemical vapor deposition (UHVCVD) process.

According to some exemplary embodiments, the selective single crystalline growth process for forming the first single crystalline layer 140 may be performed under a pressure of about 100 Torr or less and at a deposition temperature of about 550° C. to about 650° C. Further, the selective single crystalline growth process for forming the first single crystalline layer 140 may be performed using a first reaction gas including a source gas and a carrier gas. The source gas may be supplied at a flow rate of about 10 sccm to about 50 sccm (standard cubic centimeters per minute), and the carrier gas may be supplied at a flow rate of about 10 sccm to about 50 sccm.

If the deposition temperature of the selective single crystalline growth process is higher than 650° C., a grow rate of the first single crystalline layer 140 may increase to cause nucleation on the mask pattern 130. Thus, in particular exemplary embodiments, the selective single crystalline growth process for forming the first single crystalline layer 140 may be performed at a deposition temperature of 650° C. or lower.

Further, if the flow rate of the source gas used in the selective single crystalline growth process is greater than 50 sccm, voids may be formed in the first single crystalline layer 140 to degrade the reliability of photo detector. Thus, in particular exemplary embodiments, the source gas used in the selective single crystalline growth process may be supplied at a flow rate of 50 sccm or less.

When the first single crystalline layer 140 includes a germanium element, the source gas may include germane ($GeH_4$) and the carrier gas may include a hydrogen gas. In such a case, a content of the germane in a total gas may be about 5 vol % to about 30 vol %.

A second single crystalline layer 150 may be formed on the first single crystalline layer 140. In an exemplary embodiment, the second single crystalline layer 150 may be formed such that a top surface of the second single crystalline layer 150 is substantially coplanar with a top surface of the mask pattern 130, but not limited thereto. Unlike the drawings, the second single crystalline layer 150 may be formed such that a top surface of the second single crystalline layer 150 is located at a higher or lower level than a top surface of the mask pattern 130. In some exemplary embodiments, the second single crystalline layer 150 may be formed to a thickness of about 50 nanometers to about 300 nanometers.

The second single crystalline layer 150 and the semiconductor layer 120 may include the same semiconductor element, and the second single crystalline layer 150 may include a semiconductor element different from a semiconductor element included in the first single crystalline layer 140. For example, when the semiconductor layer 120 includes a silicon element and the first single crystalline layer 140 includes a germanium element, the second single crystalline layer 150 may include a silicon element, but not limited thereto. That is, the second single crystalline layer 150 may include both the same semiconductor element as the first single crystalline layer 140 and a different semiconductor element from the first single crystalline layer 140. For example, when the first single crystalline layer 140 includes a germanium element, the second single crystalline layer 150 may include a germanium element and a silicon element.

The second single crystalline layer 150 may be formed to include dopants of a second conductivity type. The second conductivity type may be different from the first conductivity type. For example, when the first conductivity type is an N-type, the second conductivity type may be a P-type. Alternatively, when the first conductivity type is a P-type, the second conductivity type may be an N-type.

According to some exemplary embodiments, the second single crystalline layer 150 may be formed using a selective single crystalline growth process. For example, the selective single crystalline growth process for forming the second single crystalline layer 150 may be performed using a reduced pressure chemical vapor deposition (RPCVD) process and/or an ultra-high vacuum chemical vapor deposition (UHVCVD) process.

According to some exemplary embodiments, the selective single crystalline growth process for forming the second single crystalline layer 150 may be performed under a pressure of about 100 Torr or less and at a deposition temperature of about 600° C. to about 800° C. Further, the selective single crystalline growth process for forming the second single crystalline layer 150 may be performed using a second reaction gas including a source gas and a carrier gas. The source gas may be supplied at a flow rate of about 50 sccm to about 500 sccm, and the carrier gas may be supplied at a flow rate of about 5 sccm to about 50 sccm. In some exemplary embodiments, the source gas may include a semiconductor element. For example, the source gas may include at least one of a dichlorosilane ($SiH_2Cl_2$) gas, a silicon tetrachloride ($SiCl_4$) gas, a silane ($SiH_4$) gas and a germane ($GeH_4$) gas. For example, when the second single crystalline layer 150 is formed of a silicon material, the source gas may include a dichlorosilane ($SiH_2Cl_2$) gas, a silicon tetrachloride ($SiCl_4$) gas or a silane ($SiH_4$) gas. When the second single crystalline layer 150 is formed of a silicon-germanium (SiGe) compound material, the source gas may include a silane ($SiH_4$) gas and a germane ($GeH_4$) gas.

According to some exemplary embodiments, the second reaction gas may further include an etching gas and a dopant gas. For example, the second reaction gas may further include a hydrogen chloride (HCl) gas used as the etching gas and a diborane ($B_2H_6$) gas or a phosphine ($PH_3$) gas used as the dopant gas. In such a case, the hydrogen chloride (HCl) gas may be supplied at a flow rate of about 10 sccm to about 200 sccm.

According to some exemplary embodiments, the selective single crystalline growth processes for forming the first and second single crystalline layers 140 and 150 may be performed in a single process chamber. That is, the first and second single crystalline layers 140 and 150 may be formed using an in-situ process without any vacuum break.

Referring to FIGS. 4A and 4B, the mask pattern 130 may be removed. The mask pattern 130 may be removed by a wet etching process that utilizes an etchant exhibiting an etch selectivity with respect to the semiconductor layer 120 and the second single crystalline layer 150.

Figure 5B:
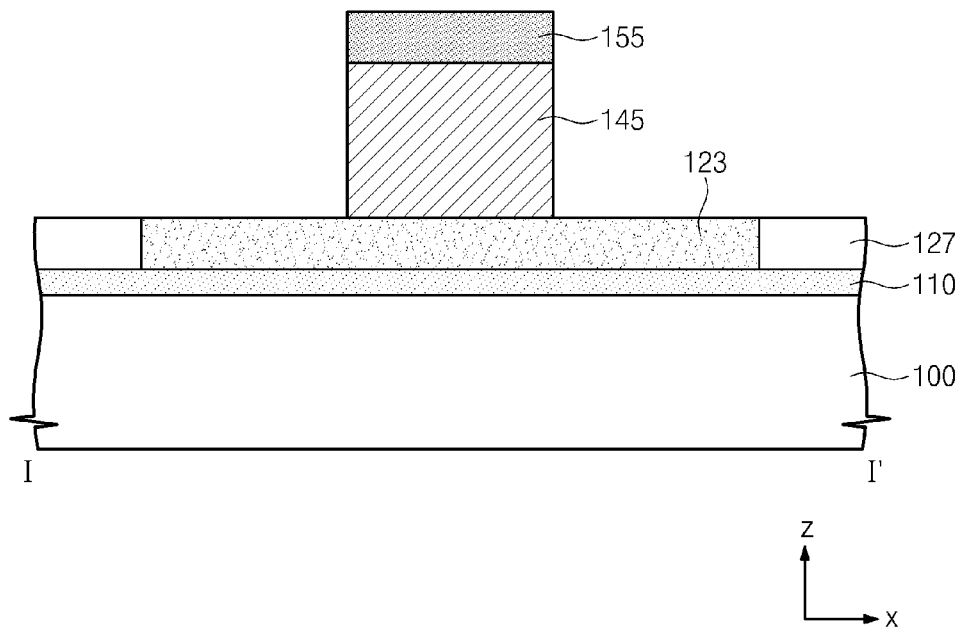
Figure 5C:
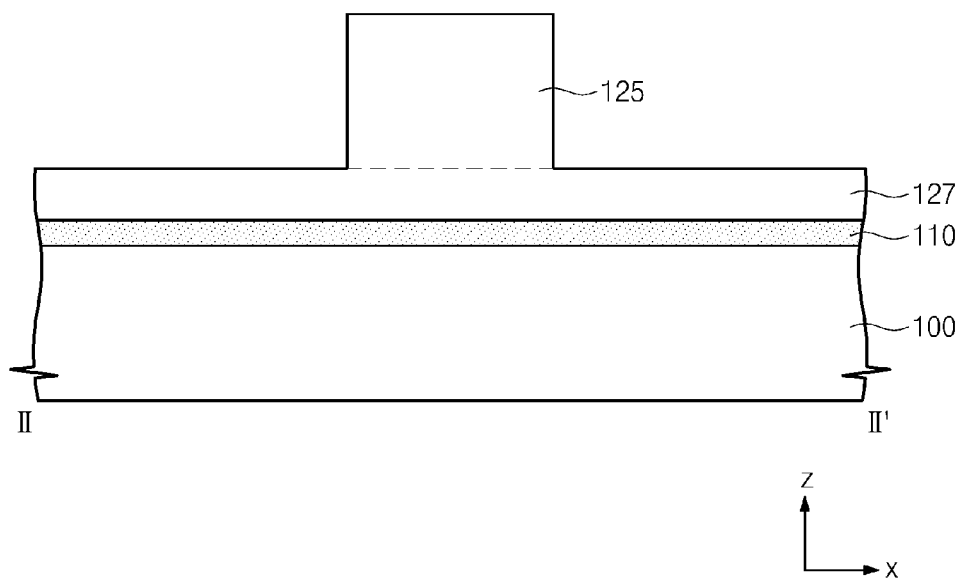
FIG. 5C is a cross sectional view taken along a line II-II' of FIG. 5A to illustrate a method of forming a photo detector according to an exemplary embodiment.

Referring to FIGS. 5A, 5B and 5C, the semiconductor layer 120, the first single crystalline layer 140 and the second single crystalline layer 150 may be patterned to form an optical waveguide 125, a first single crystalline pattern 145 and a second single crystalline pattern 155. The optical waveguide 125, the first single crystalline pattern 145 and the second single crystalline pattern 155 may be formed by forming a mask pattern that extends in a second direction and covers a portion of the semiconductor layer 120 and a portion of the second single crystalline layer 150, and by etching the semiconductor layer 120 and the first and second single crystalline layers 140 and 150 using the mask pattern as an etch mask. In an exemplary embodiment, the second direction may intersect the first direction. For example, the second direction may be parallel with a y-axis. Etching the semiconductor layer 120 and the first and second single crystalline layers 140 and 150 may be performed using a dry etching technique. In some exemplary embodiments, etching the semiconductor layer 120 and the first and second single crystalline layers 140 and 150 may be performed in a single process chamber. That is, the semiconductor layer 120 and the first and second single crystalline layers 140 and 150 may be etched using an in-situ process without any vacuum break.

Alternatively, the optical waveguide 125, the first single crystalline pattern 145 and the second single crystalline pattern 155 may be formed using another patterning process which is different from the patterning process described above. That is, the first and second single crystalline patterns 145 and 155 may be fabricated by forming a first mask pattern that covers a portion of the second single crystalline layer 150 and by etching the first and second single crystalline layers 140 and 150 using the first mask pattern as an etch mask, and the optical waveguide 125 may be fabricated by forming a second mask pattern that covers a portion of the semiconductor layer 120 and by partially etching the semiconductor layer 120 using the second mask pattern as an etch mask.

The optical waveguide 125 may be formed to have a line-shape extending in the second direction when viewed from a top plan view. In an exemplary embodiment, the optical waveguide 125 may be formed to be in contact with a sidewall of the first single crystalline pattern 145. The optical waveguide 125 may be formed to include a portion of the semiconductor layer 120. That is, optical waveguide 125 may be formed to upwardly protrude from a remained semiconductor layer 127. In some exemplary embodiments, the optical waveguide 125 may be formed such that a top surface of the optical waveguide 125 is substantially coplanar with a top surface of the first single crystalline pattern 145, but not limited thereto. That is, unlike the drawings, the optical waveguide 125 may be formed such that a top surface of the optical waveguide 125 is located at a higher or lower level than a top surface of the first single crystalline pattern 145.

The first single crystalline pattern 145 and the second single crystalline pattern 155 may be sequentially stacked on a portion of the doping region 123. The first single crystalline pattern 145 may be disposed between both ends of the doping region 123 when viewed from a plan view. That is, the first single crystalline pattern 145 may include a pair of parallel sidewalls adjacent to both ends of the doping region 123, and both ends of the doping region 123 may be arrayed along the first direction. Therefore, both ends of the doping region 123 may be exposed by the etching process for forming the first single crystalline pattern 145.

Figure 6A:
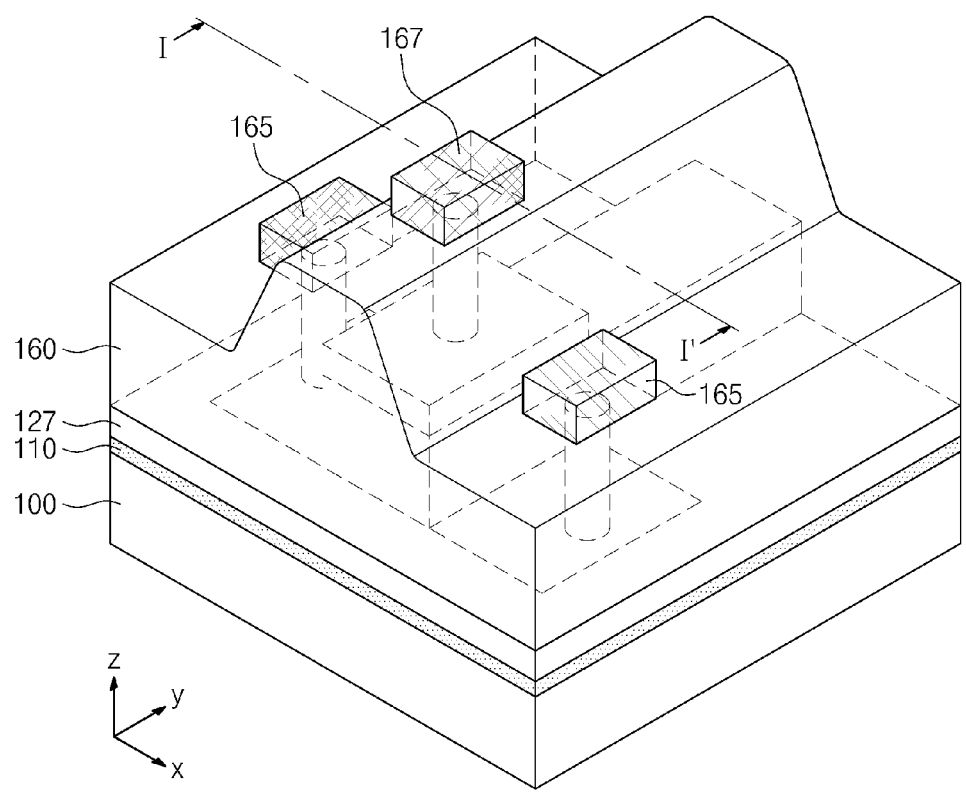
Figure 6B:
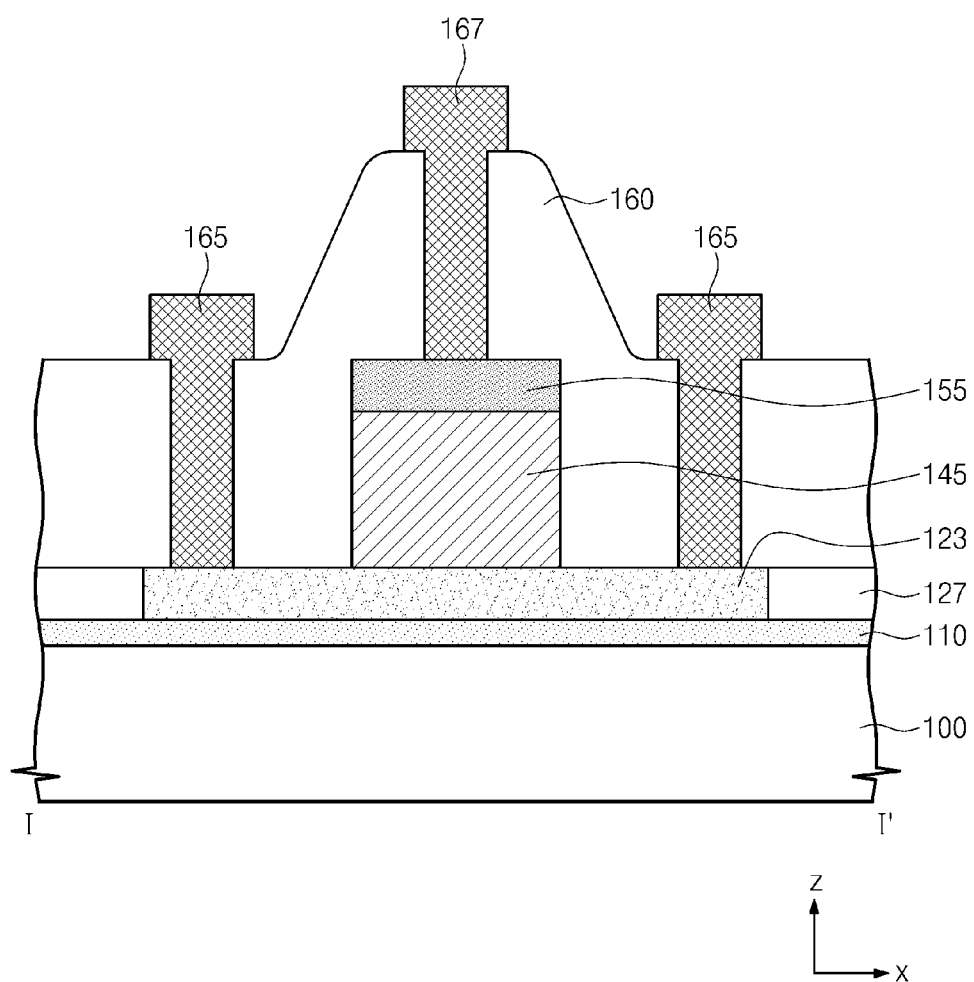

Referring to FIGS. 6A and 6B, an interlayer dielectric layer 160 may be formed on the substrate including the first and second single crystalline patterns 145 and 155. The interlayer dielectric layer 160 may be formed to include an oxide layer, a nitride layer or an oxynitride layer. The interlayer dielectric layer 160 may be formed using a chemical vapor deposition (CVD) process.

A pair of first metal pads 165 and a second metal pad 167 may be formed in the interlayer dielectric layer 160. The pair of first metal pads 165 may be electrically connected to both ends of the doping region 123, respectively. Further, the second metal pad 167 may be electrically connected to the second single crystalline pattern 155.

According to some exemplary embodiments, the pair of first metal pads 165 and the second metal pad 167 may be arrayed along a column which is parallel with the first direction. The second metal pad 167 may be disposed between the pair of first metal pads 165.

The pair of first metal pads 165 and the second metal pad 167 may be fabricated by forming holes in the interlayer dielectric layer 160 and by filling the holes with a conductive material. In an exemplary embodiment, the pair of first metal pads 165 and the second metal pad 167 may be formed to extend and protrude from a top surface of the interlayer dielectric layer 160. According to the exemplary embodiment described above, the optical waveguide 125 may be formed during the etching process for forming the first and second single crystalline patterns 145 and 155. That is, the optical waveguide 125 and the first and second single crystalline patterns 145 and 155 may be simultaneously formed. Thus, additional processes for forming only the optical waveguide 125 may not be required. If the first and second single crystalline patterns 145 and 155 are not formed by patterning the first and second single crystalline layers 140 and 150 after formation of the first and second single crystalline layers 140 and 150 in the trench(121), the single crystalline patterns 145 and 155 and the optical waveguide 125 should be formed using two separate patterning processes. Thus, according to the exemplary embodiment, fabrication processes of the photo detectors can be simplified.

Moreover, according to the exemplary embodiment, the optical waveguide 125 may be formed to be self-aligned with the first single crystalline pattern 145. Thus, the exemplary embodiment may minimize or prevent some failures which are due to a misalignment between the optical waveguide 125 and the first single crystalline pattern 145.

According to the embodiments set forth above, an optical waveguide and first and second single crystalline patterns are simultaneously formed without use of two separate patterning processes. Thus, additional processes for forming only the optical waveguide 125 can be omitted to simplify a fabrication process of a photo detector. This may lead to reduction of fabrication costs of the photo detector.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of forming a photo detector, the method comprising:
   forming a semiconductor layer over a substrate;
   forming a trench in a first portion of the semiconductor layer such that a portion of the semiconductor layer remains under the trench;
   injecting dopants of a first conductivity type into the portion of the semiconductor layer remaining under the trench to form a doping region;
   forming a first single crystalline layer and a second single crystalline layer using a selective single crystalline growth process in the trench;
   patterning the first and second single crystalline layers and a second portion of the semiconductor layer to form first and second single crystalline patterns and an optical waveguide, respectively, the second portion being adjacent to the first portion, the optical waveguide including a part of the semiconductor layer;
   forming an interlayer dielectric layer over the substrate including the first single crystalline pattern, the second single crystalline pattern, and the optical waveguide; and
   forming a first metal pad and a second metal pad that penetrate the interlayer dielectric layer,
   wherein the first metal pad is formed to contact the doping region and the second metal pad is formed to contact the second single crystalline pattern.

2. The method of claim 1, wherein a buried insulation layer is disposed between the semiconductor layer and the substrate.

3. The method of claim 2, wherein the doping region is formed to contact the buried insulation layer.

4. The method of claim 1, wherein the second single crystalline pattern includes dopants of a second conductivity type and the second conductivity type is different from the first conductivity type.

5. The method of claim 1, wherein forming the first and second single crystalline patterns and the optical waveguide includes etching a portion of the first single crystalline layer, a portion of the second single crystalline layer, and part of the second portion of the semiconductor layer to expose at least a portion of the doping region.

6. The method of claim 1, wherein the optical waveguide is formed by patterning the second portion of the semiconductor layer so that a top surface of the optical waveguide is higher than a bottom surface of the trench.

7. The method of claim 1, wherein the first and second single crystalline patterns and the optical waveguide are formed using two separate patterning processes.

8. The method of claim 1, wherein forming the first single crystalline layer includes growing a single crystalline layer on sidewalls and a bottom surface of the trench.

9. The method of claim 1, wherein the selective single crystalline growth process is performed using a reduced pressure chemical vapor deposition (RPCVD) process or an ultrahigh vacuum chemical vapor deposition (UHVCVD) process.

10. The method of claim 9, wherein the first single crystalline layer is formed by the RPCVD process or the UHVCVD process that is performed using a first reaction gas including a germane ($GeH_4$) gas and a hydrogen gas at a deposition temperature of about 550° C. to about 650° C., and the first reaction gas is supplied at a flow rate of about 10 sccm to about 50 sccm.

11. The method of claim 9, wherein the second single crystalline layer is formed by the RPCVD process or the UHVCVD process that is performed using a second reaction gas including a source gas containing a semiconductor element, a carrier gas and an etching gas at a deposition temperature of about 600° C. to about 800° C.

12. The method of claim 11,
   wherein the source gas includes at least one of a dichlorosilane ($SiH_2Cl_2$) gas, a silicon tetrachloride ($SiCl_4$) gas, a silane ($SiH_4$) gas and a germane ($GeH_4$) gas;
   wherein the carrier gas includes a hydrogen gas; and
   wherein the etching gas includes a hydrogen chloride (HCl) gas.

13. The method of claim 11, wherein the hydrogen chloride (HCl) gas is supplied at a flow rate of about 10 sccm to about 200 sccm.

14. The method of claim 11,
   wherein the second reaction gas further includes a dopant gas; and
   wherein the dopant gas includes a diborane ($B_2H_6$) gas or a phosphine ($PH_3$) gas.

15. The method of claim 1, wherein the selective single crystalline growth process for forming the first single crystalline layer and the second single crystalline layer are performed in a single process chamber.

16. The method of claim 1, wherein a depth of the trench is equal to a width thereof or at least 1.5 times greater than the width of the trench in one direction.

17. The method of claim 1, wherein the second single crystalline layer is formed to have a thickness of about 50 nanometers to about 300 nanometers.

18. A method of forming a photo detector, the method comprising:
   forming a semiconductor layer over a substrate;

forming a trench in a first portion of the semiconductor layer such that a portion of the semiconductor layer remains under the trench;

injecting dopants of a first conductivity type into the portion of the semiconductor layer remaining under the trench to form a doping region;

forming a first single crystalline layer and a second single crystalline layer using a selective single crystalline growth process in the trench; and patterning the first and second single crystalline layers and a second portion of the semiconductor layer to form first and second single crystalline patterns and an optical waveguide, respectively, the second portion being adjacent to the first portion, wherein the optical waveguide includes a protruding portion of the semiconductor layer obtained by patterning the second portion, and has a line-shape extending in one direction;

wherein an end of the optical waveguide is in contact with the first single crystalline pattern, and wherein forming the first and second single crystalline patterns and the optical waveguide includes etching a portion of the first single crystalline layer, a portion of the second single crystalline layer, and part of the second portion of the semiconductor layer to expose at least a portion of the doping region.

19. The method of claim 18, wherein the first single crystalline pattern and the second single crystalline pattern are formed to have a planar top surface.

* * * * *